United States Patent
Wang et al.

(10) Patent No.: US 9,954,070 B2
(45) Date of Patent: Apr. 24, 2018

(54) THIN FILM TRANSISTOR AND MANUFACTURING METHOD THEREOF, DISPLAY DEVICE

(71) Applicant: BOE TECHNOLOGY GROUP CO., LTD., Beijing (CN)

(72) Inventors: Longyan Wang, Beijing (CN); Yongqian Li, Beijing (CN); Kun Cao, Beijing (CN); Quanhu Li, Beijing (CN); Jingwen Yin, Beijing (CN); Baoxia Zhang, Beijing (CN); Cuili Gai, Beijing (CN); Zhongyuan Wu, Beijing (CN); Gang Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/913,581

(22) PCT Filed: Jul. 28, 2015

(86) PCT No.: PCT/CN2015/085302
§ 371 (c)(1),
(2) Date: Feb. 22, 2016

(87) PCT Pub. No.: WO2016/150056
PCT Pub. Date: Sep. 29, 2016

(65) Prior Publication Data
US 2017/0033192 A1 Feb. 2, 2017

(30) Foreign Application Priority Data
Mar. 25, 2015 (CN) .......................... 2015 1 0134375

(51) Int. Cl.
*H01L 29/10* (2006.01)
*H01L 29/04* (2006.01)
(Continued)

(52) U.S. Cl.
CPC ........ *H01L 29/45* (2013.01); *H01L 21/28575* (2013.01); *H01L 21/32134* (2013.01);
(Continued)

(58) Field of Classification Search
CPC ................. H01L 29/45; H01L 29/2003; H01L 21/28575; H01L 21/32134; H01L 21/443;
(Continued)

(56) References Cited

U.S. PATENT DOCUMENTS 7,282,782 B2  10/2007 Hoffman et al.
2003/0218222 A1  11/2003 Wager, III et al.
(Continued)

FOREIGN PATENT DOCUMENTS

CN  1930692 A  3/2007
CN  102637591 A  8/2012
(Continued)

OTHER PUBLICATIONS

Machine english translation of Chinese Patent Application CN103700665.*
(Continued)

*Primary Examiner* — Dzung Tran
(74) *Attorney, Agent, or Firm* — Collard & Roe, P.C.

(57) ABSTRACT

A thin film transistor, a manufacturing method thereof, and a display device are provided. The thin film transistor includes a gate electrode (21), an active layer (23), a source electrode (241) and a drain electrode (242). The source electrode (241) and the drain electrode (242) are formed of at least two materials, the forming materials of the source electrode (241) and the drain electrode (242) can create a cell reaction in a corresponding etching solution so as to be etched, and material of the active layer (23) is not corroded by the etching solution. With the thin film transistor and manufacturing method thereof according to embodiments of
(Continued)

the invention, a problem that an active layer is liable to be corroded in an etching procedure of a source electrode and a drain electrode can be solved, and thus the thin film transistor device can be manufactured by using a back channel etch process. Consequently, the process number for manufacture of the thin film transistor is decreased, and the manufacturing cost is saved.

8 Claims, 3 Drawing Sheets

(51) Int. Cl.
| | | |
|---|---|---|
| H01L 29/45 | (2006.01) | |
| H01L 29/786 | (2006.01) | |
| H01L 21/285 | (2006.01) | |
| H01L 21/3213 | (2006.01) | |
| H01L 21/443 | (2006.01) | |
| H01L 21/4763 | (2006.01) | |
| H01L 29/20 | (2006.01) | |
| H01L 29/22 | (2006.01) | |
| H01L 29/24 | (2006.01) | |
| H01L 29/423 | (2006.01) | |
| H01L 29/66 | (2006.01) | |

(52) U.S. Cl.
CPC ...... *H01L 21/443* (2013.01); *H01L 21/47635* (2013.01); *H01L 29/20* (2013.01); *H01L 29/2003* (2013.01); *H01L 29/22* (2013.01); *H01L 29/24* (2013.01); *H01L 29/42356* (2013.01); *H01L 29/66522* (2013.01); *H01L 29/66742* (2013.01); *H01L 29/66969* (2013.01); *H01L 29/786* (2013.01); *H01L 29/7869* (2013.01); *H01L 29/78681* (2013.01)

(58) Field of Classification Search
CPC ... H01L 21/47635; H01L 29/22; H01L 29/24; H01L 29/42356; H01L 29/66522; H01L 29/66969; H01L 29/786; H01L 29/78681; H01L 29/7869
USPC ................................ 257/43, 59; 438/104, 99
See application file for complete search history.

(56) References Cited

U.S. PATENT DOCUMENTS

| | | | | |
|---|---|---|---|---|
| 2008/0258141 | A1* | 10/2008 | Park | H01L 29/78618 257/43 |
| 2008/0258143 | A1* | 10/2008 | Kim | H01L 29/458 257/43 |
| 2008/0296568 | A1* | 12/2008 | Ryu | H01L 21/02554 257/43 |
| 2010/0025678 | A1* | 2/2010 | Yamazaki | H01L 27/1225 257/43 |
| 2010/0032665 | A1* | 2/2010 | Yamazaki | H01L 29/78618 257/43 |
| 2014/0077301 | A1* | 3/2014 | Gai | H01L 27/124 257/355 |

FOREIGN PATENT DOCUMENTS

| | | |
|---|---|---|
| CN | 103337462 A | 10/2013 |
| CN | 103700665 A | 4/2014 |
| CN | 104716198 A | 6/2015 |

OTHER PUBLICATIONS

Uhm, Hyun Seok et al. "A Two-Mask Process for Fabrication of Bottom-Gate IGZO-Based TFTs." IEEE Electron Device Letters, vol. 33, No. 4, Apr. 2012, pp. 543-545.
Xu, Hua et al. "High performance indium-zinc-oxide thin-film transistors fabricated with a back-channel-etch-technique." Applied Physics Letters 99, 253501 (2011).
International Search Report of PCT/CN2015/085302 in Chinese, dated Dec. 31, 2015 with English translation.
Notice of Transmittal of the International Search Report of PCT/CN2015/085302 in Chinese, dated Dec. 31, 2015.
Written Opinion of the International Searching Authority of PCT/CN2015/085302 in Chinese, dated Dec. 31, 2015 with English translation.
Chinese Office Action in Chinese Application No. 201510134375.1, dated Mar. 14, 2017 with English translation.
Second Chinese Office Action in Chinese Application No. 201510134375.1, dated Nov. 8, 2017 with English translation.

\* cited by examiner

THIN FILM TRANSISTOR AND MANUFACTURING METHOD THEREOF, DISPLAY DEVICE

CROSS REFERENCE TO RELATED APPLICATIONS

This application is the National Stage of PCT/CN2015/085302 filed on Jul. 28, 2015, which claims priority under 35 U.S.C. § 119 of Chinese Application No. 201510134375.1 filed on Mar. 25, 2015, the disclosure of which is incorporated by reference.

TECHNICAL FIELD

Embodiments of the present invention relate to a thin film transistor and a manufacturing method thereof, a display device.

BACKGROUND

Thin Film Transistor TFTs with a compound semiconductor (the representative of which is metal oxide) as the material of an active layer have the merits of high mobility, simple manufacturing process, good large-area homogeneity, low manufacturing cost, etc., and are regarded as the most promising devices for driving Active Matrix Organic Light Emitting Diode (AMOLED) to display. Therefore, compound semiconductor TFTs attract a lot of attentions of the industry in recent years, and are gradually applied to AMOLED display panels.

In the manufacturing technology of TFTs, the Back Channel Etch (BCE) process is a common process for amorphous silicon TFTs, and TFTs can be formed by only four photolithographic processes. A gate electrode of a TFT is formed by the first photolithographic process, a semiconductor layer of the TFT is formed by the second photolithographic process, a source electrode and a drain electrode of the TFT are formed by the third photolithographic process, and a passivation-layer via hole of the TFT is formed by the fourth photolithographic process. The BCE process is widely adopted by an existing amorphous silicon (a-Si) TFT panel production line because it needs smaller mask number (four masks) and fewer process steps. Taking metal oxide TFTs as examples, theoretically, the manufacturing process of compound semiconductor TFTs should be the same as that of amorphous silicon TFTs. But whether a dry etching or a wet etching will cause damage to a compound semiconductor active layer possessing a relatively vulnerable chemical stability, and thus the device performance is affected ultimately. Namely, with the BCE process, the compound semiconductor active layer will be damaged simultaneous with the formation of a source electrode and a drain electrode. Therefore, the BCE process cannot be directly used to manufacture a compound semiconductor thin film transistor, and it is necessary to add a manufacturing process of an etch barrier layer useful for protecting a compound semiconductor active layer. However, after the etch barrier layer is added, the mask number necessary for the manufacturing process is increased consequently, and the process becomes complicated and the cost is increased accordingly.

SUMMARY

According to one embodiment of the present invention, there is provided a thin film transistor, which includes a gate electrode, an active layer, a source electrode and a drain electrode, wherein, the source electrode and the drain electrode are formed of at least two materials, the at least two materials being able to create a cell reaction in a corresponding etching solution so as to be etched, and a material of the active layer is not corroded by the etching solution.

According to another embodiment of the present invention, there is provided a display device, which includes the above thin film transistor.

According to still another embodiment of the present invention, there is provided a manufacturing method of a thin film transistor, which includes the following steps:
providing a base substrate;
forming a gate electrode and a gate insulating layer; and
forming an active layer and a source electrode, a drain electrode, the source electrode and the drain electrode include at least two materials, the at least two materials being able to create a cell reaction in a corresponding etching solution so as to be etched, and a material of the active layer is not corroded by the etching solution.

BRIEF DESCRIPTION OF THE DRAWINGS

In order to illustrate the technical solution of the embodiments of the invention more clearly, the drawings of the embodiments will be briefly introduced below; it is obvious that the drawings as described below are only related to some embodiments of the invention, but not limitative of the invention.

DETAILED DESCRIPTION

Figure 1:
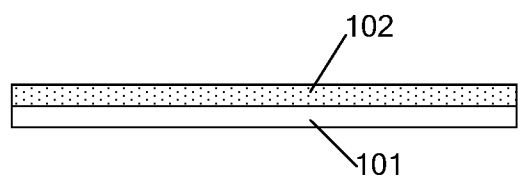
FIG. 1 illustrates a structure of a composite film layer of a source electrode and a drain electrode provided by an embodiment of the invention.

In order to make objects, technical details and advantages of the embodiments of the invention apparent, hereinafter, the technical solutions of the embodiments of the invention will be described in a clearly and fully understandable way in connection with the drawings related to the embodiments of the invention. It is obvious that the described embodiments are just a part but not all of the embodiments of the invention. Based on the described embodiments of the invention, those ordinarily skilled in the art can obtain other embodiment(s), without any inventive work, which should be within the scope sought for protection by the invention.

According to at least an embodiment of the present invention, there is provided a thin film transistor, which includes a gate electrode, an active layer, a source electrode and a drain electrode. The source electrode and the drain electrode are formed of at least two materials, the materials for forming the source electrode and the drain electrode can create a cell reaction in a corresponding etching solution so as to be etched, and, the etching solution does not corrode the active layer. For example, the cell reaction here refers to the following situation: in an etching solution, two materials are involved in an oxidation reaction and a reduction reaction, respectively, and these two materials are etched during the oxidation reaction and the reduction reaction.

Aiming at the problem that an active layer of a TFT is liable to be corroded by an etching solution for use in the procedure of forming a source electrode and a drain electrode, the following scheme is adopted in at least one embodiment: materials for a source electrode and a drain electrode in a thin film transistor are chosen as such materials that are capable of creating a cell reaction in a certain electrolyte, meanwhile the electrolyte corresponding to occurrence of the cell reaction is used as an etching solution in the procedure of forming the source electrode and the drain electrode, and the electrolyte does not corrode an active layer of the thin film transistor when it serves as the etching solution. It is understandable that, the above wording that the etching solution does not corrode the active layer, also includes the situation that the corrosion speed of the active layer by use of the etching solution is very slow and it is approximately not corroded upon concrete implementation.

Furthermore, the material for forming a source electrode and a drain electrode generally includes at least two, one of which is involved in the chemical reaction of the positive electrode of the cell, and the other one of which is involved in the chemical reaction of the negative electrode of the cell, and it can also include other component having an assistant function for the cell reaction, or other component irrelevant to the cell reaction.

It is to be noted that, "the etching solution does not corrode the active layer" refers to the situation that in the etching solution (or under the working conditions involved in the production of a source electrode and a drain electrode), the active layer will not be degenerated and damaged due to the fact that an environment surrounding it undergoes a chemical or electrochemical action, and physical and chemical properties of the film layer of the active layer will not be changed, either, or even if they are changed, impact of this change on the TFT is small enough to be ignored. "Corrode" herein also includes the combined action of the above factor and a mechanical factor or a biological factor.

The above material for forming the source electrode and the drain electrode includes at least two, but there is no limit on the specific film forming mode. It may be the case that the above at least two materials are formed to be a thin film of a mixed material; and it may also be the case that multiple films are laminated, and each layer of the films is formed of one material. In any case, as long as it is ensured that in the procedure of forming a source electrode and a drain electrode, film materials used for forming the source electrode and the drain electrode can create a cell reaction in a corresponding etching solution so as to be etched, and, the etching solution does not corrode an active layer, the following case is made possible: a thin film transistor that requires addition of a procedure of forming an etch barrier layer originally can be manufactured by directly using a back channel etch process, without the need of adding the etch barrier layer. Thus, the number of patterning process can be decreased, and the manufacturing cost is reduced. Furthermore, materials of the two layers can be removed simultaneously by the cell reaction upon formation of a source electrode and a drain electrode, without the need of etching material of each layer separately, and the cell reaction has a fast etching speed, thereby saving the etch time.

Exemplarily, a source electrode and a drain electrode of a thin film transistor are formed of two materials capable of creating a cell reaction in a certain electrolyte, and the source electrode and the drain electrode are formed by adopting the latter film forming manner. Specifically, as illustrated in FIG. 1, it includes a first film layer 101 formed of one of the two materials, and a second film layer 102 formed of the other one of the two materials. The second film layer 102 covers the first film layer 101, and the second film layer 102 has ostioles provided therein for the convenience of penetration of an etching solution. As such, materials of the second film layer 102 and the first film layer 101 can undergo a cell reaction in the etching solution (namely, a corresponding electrolyte) simultaneously, and the etching rate is accelerated without raising the concentration of the etching solution. Thus, the time in which the substrate is immersed in the etching solution is decreased, and the risk that an active layer is damaged by the etching solution is further reduced.

Exemplarily, the above source electrode and drain electrode are formed of two materials, which include aluminum and indium tin oxide; the etching solution (i.e. an electrolyte in which these two materials undergo a cell reaction) is an alkaline solution, such as sodium hydroxide solution, or potassium hydroxide solution, or tetramethylammonium hydroxide solution. The specific etching principle is as follows:

Anode: $Al + 4OH^- \rightarrow H_2AlO_3^- + H_2O + 3e$; 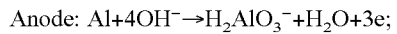

Cathode: $In_2O_3 + 3H_2O + 6e \rightarrow 2In^{3+} + 6OH^-$   $2H_2O + 2e \rightarrow 2OH^- + H_2$. 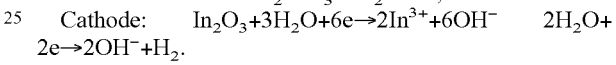

In this case, a corresponding active layer is formed of a compound semiconductor that is not etched by an alkaline etching solution (or the etch speed is very slow).

Exemplarily, the compound semiconductor includes one of more selected from the group consisting of indium gallium zinc oxide, indium titanium zinc oxide, indium tin zinc oxide, zinc tin oxide, aluminum zinc tin oxide, aluminum zinc oxide, gallium zinc oxide, cadmium sulfide, cadmium selenide, cadmium telluride, gallium nitride, gallium phosphide, gallium arsenide and molybdenum sulfide. In addition to the above-mentioned compound semiconductors, the scheme provided in the above embodiments is also suitable for TFT based on an active layer produced with black phosphorus.

Further, the thin film transistor further includes a metal layer (not illustrated in the figure) that is disposed over the source electrode and the drain electrode, and used for providing protection for the source electrode and the drain electrode in subsequent procedures, and the metal layer has the same pattern as the source electrode and the drain electrode.

After formation of the source electrode and the drain electrode, it further includes cleaning, baking and other steps, and after that, it also needs subsequent procedures for forming other layers continually. Cleaning liquids or etching solutions for other layers are mostly alkaline, and they will give rise to corrosion of the formed source electrode and the drain electrode. For example, a metal layer having the same pattern as a source electrode and a drain electrode is disposed over the source electrode and the drain electrode, so as to solve the problem of corroding the source electrode and the drain electrode. Mo that is relatively stable in an alkaline solution may be chosen for the metal layer, and is removed with an acid etching solution.

According to at least an embodiment of the present invention, there is provided a manufacturing method of a thin film transistor, which includes the following steps:

providing a base substrate;

forming a gate electrode and a gate insulating layer; for example, the gate electrode and the gate insulating layer may be formed by a patterning process that may include coating of a photoresist, exposure, development, etching and so on; and depositing and forming an active layer, a source electrode and a drain electrode by patterning process, the source electrode and the drain electrode include at least two materials, the at least two materials can create a cell reaction in a corresponding etching solution so as to be etched, and the etching solution does not corrode the active layer.

Aiming at the problem that a compound semiconductor active layer in a BCE structure is liable to be damaged by an etching solution in the procedure of forming a source electrode and a drain electrode, with a manufacturing method of a thin film transistor provided by at least an embodiment of the invention, without adding an etch barrier layer, the thin film transistor can be manufactured by directly using a back channel etch process. Thus, the number of patterning process can be decreased, and the manufacturing cost is reduced.

It is to be noted that, the manufacturing method of the thin film transistor provided by at least an embodiment of the invention, is suitable for thin film transistors with bottom-gate structure, but this does not exclude the case that it is also suitable for thin film transistors with top-gate structure. Upon concrete implementation, simple changes or replacements of various steps and sequence of the manufacturing method of the thin film transistor, which are made by those skilled in the art within the technical scope disclosed by the present invention according to actual circumstances, also shall be embraced within the protection scope of the present invention.

In order that the thin film transistor and the manufacturing method thereof provided by embodiments of the invention are better understood by those skilled in the art, technical solutions provided by the present invention will be described below in detail by specific embodiments.

Figure 2:
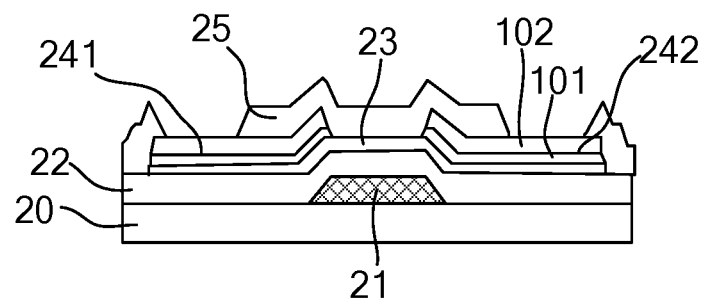
FIG. 2 is a structurally schematic view illustrating a cross section of a thin film transistor provided by an embodiment of the invention.

As illustrated in FIG. 2, a thin film transistor according to the embodiment includes a substrate 2, and a gate electrode 21, a gate insulating layer 22, an active layer 23, a source electrode 241, a drain electrode 242 and a passivation layer 25 disposed on the substrate 20 from bottom to top. The active layer 23 includes Indium Gallium Zinc Oxide (IGZO); the source electrode 241 and the drain electrode 242 are formed of two materials (i.e. aluminum and indium tin oxide), and the source electrode 241 and the drain electrode 242 include a first film layer 101 formed of aluminum and a second film layer 102 formed of indium tin oxide. The second film layer 102 covers the first film layer 101, and ostioles facilitating the penetration of an etching solution are provided in the second film layer 102. Materials of the first film layer and the second film layer are not necessarily limited as such, and it is also possible that the first film layer is formed with indium tin oxide, and the second film layer is formed with aluminum.

The active layer material may also be other compound semiconductor that is not etched by an alkaline etching solution (or the etch speed is very slow), such as, one of more selected from the group consisting of indium gallium zinc oxide, indium tin zinc oxide, indium titanium zinc oxide, zinc tin oxide, aluminum zinc tin oxide, aluminum zinc oxide, gallium zinc oxide, cadmium sulfide, cadmium selenide, cadmium telluride, gallium nitride, gallium phosphide, gallium arsenide and molybdenum sulfide; or a doped system of zinc oxide ZnO such as HIZO, ITZO, ZTO, AZTO, AZO, GZO, or the like. In the above materials, some materials (such as IGZO, ITZO, HIZO and so on) will also create a cell reaction theoretically although they contain an element indium (In). However, as the compounds (gallium sesquioxide ($Ga_2O_3$), tin oxide ($SnO_2$) and hafnium dioxide ($HfO_2$)) corresponding to these elements of G (gallium, Ga), T (tin, Sn) and H (hafnium, Hf) have a high stability, these materials such as IGZO, ITZO, HIZO and the like will not participate in the cell reaction or participate in a cell reaction at a very slow rate upon acting as material of an active layer, despite the fact that they contain indium. Therefore, they can each be considered as being incorrodable in an alkaline etching solution. For example, when the above active layer is of IGZO, due to the fact that it contains a material $Ga_2O_3$ by which the structural stability of IGZO is increased, the active layer of IGZO almost does not participate in a cell reaction in an alkaline etching solution, and IGZO can be considered as not being corroded by an alkaline etching solution, either.

In some examples, an active layer may also be made into a bilayered structure. Material containing In such as IGZO or the like is used for a lower layer, while material not containing In such as ZTO, AZTO, GZO or the like is used for an upper layer. By doing this, it is ensured that material In in an active layer will not participate in a cell reaction at all.

It is to be noted that, the above active layer may be formed of one or more of the above-mentioned materials, but there is no limit on the concrete film forming mode. If the forming material of an active layer is diverse, a thin film of a mixed material can be formed by multiple materials of the above materials; and it may also be the case that multiple films are laminated, and each layer of the films is formed of one material. The present embodiment does not set a limit to this.

The implementation procedure of one manufacturing process of the above thin film transistor is as follows.

Step 1, firstly, a substrate 20 is provided and a gate metal layer is deposited on the substrate 20, and is subjected to a patterning process to form a gate electrode 21.

Figure 3:
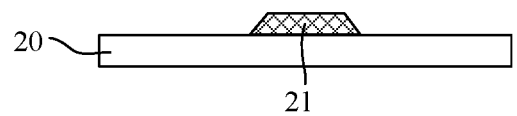
FIG. 3(a) to FIG. 3(d) are schematic views 1 illustrating a manufacturing process of a thin film transistor provided by an embodiment of the invention.
Figure 3:
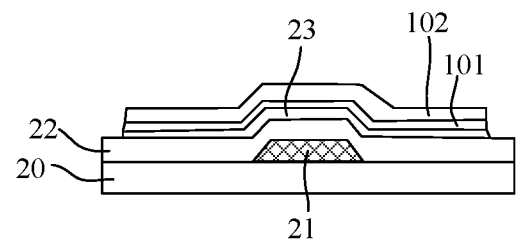
Figure 3:
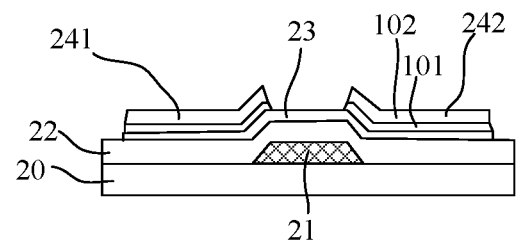
Figure 3:
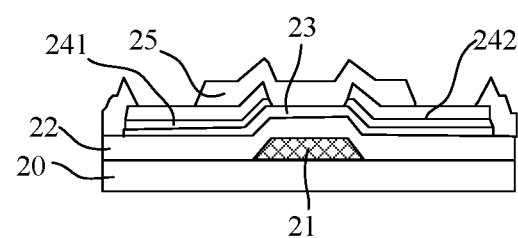
Figure 4:
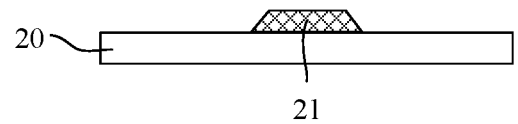
FIG. 4(a) to FIG. 4(d) are schematic views 2 illustrating a manufacturing process of a thin film transistor provided by another embodiment of the invention.
Figure 4:
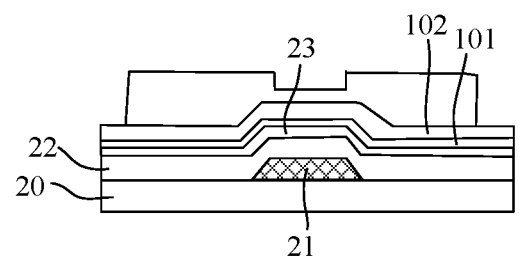
Figure 4:
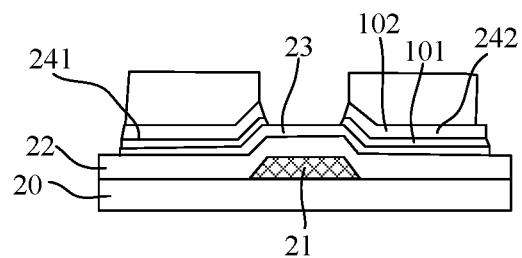
Figure 4:
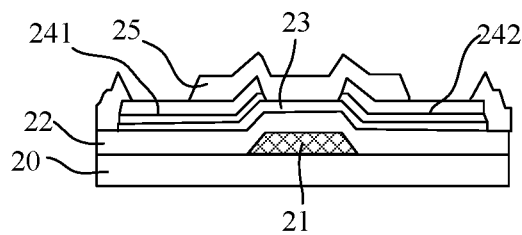

For example, in this step, a layer of highly conductive thin film is deposited on a substrate 20, and is subjected to exposure and etching, so as to form a bottom gate (Gate) of a thin film transistor. Material for the highly conductive thin film may be metal or a transparent, highly conductive compound thin film, as illustrated in FIG. 3(a) and FIG. 4(a).

Step 2, on the substrate 20 subjected to the previous procedure, a gate insulating layer 22, a semiconductor layer and a composite conductive film layer for the thin film transistor are deposited, and a patterning process is carried out, so as to form pattern of an active layer 23 and a source electrode 241 as well as a drain electrode 242.

In this step, a gate insulating layer (Gate Insulator), a layer of a compound semiconductor material (such as IGZO) and a group of composite conductive film layers (e.g. indium tin oxide ITO/aluminum Al) for forming a source electrode and a drain electrode are sequentially deposited at first. The gate insulating layer (Gate Insulator) is an insulating material with a monolayered or multilayered composite structure, such as silicon oxide, silicon nitride, aluminum oxide, hafnium oxide, an organic insulating medium or the like. The composite conductive film layer for the source and drain material includes a first film layer 101 formed of Al and a second film layer 102 formed of ITO, and the second film layer 102 is located over the first film layer 101. Or, the first film layer 101 is located over the second film layer 102, namely, a first film layer 101 formed of ITO, and a second film layer 102 formed of Al. No matter which material layer is located atop, it is necessary for a material layer on top (i.e. the second film layer 102) to have tiny Pinholes provided for an etching solution to get through (for example, a pinhole structure may be formed in it by sputtering growth of Al or ITO), with the aim of creating a cell reaction when Al and ITO encounter an alkaline solution simultaneously in the next procedure. The process of forming the second film layer 102 may be selected from sputtering, PECVD and solution process depending on the forming material. Materials used in the embodiment are aluminum and indium tin oxide, and so the sputtering process is preferred. By means of controlling the deposition speed of the sputtering process (to be slightly faster than the normal deposition speed), a film layer of aluminum or a film layer of indium tin oxide having ostioles for facilitating penetration of an etching solution can be formed naturally. Therefore, in this step, by using a method of sputtering, a second material layer (i.e. a second film layer 102) is manufactured on a first material layer (i.e. a first film layer 101).

After that, coating of a photoresist, exposure, development and etching processes are conducted. The etching process is mainly carried out on composite conductive film layers for forming a source electrode and a drain electrode and an IGZO semiconductor layer. Etching of the IGZO semiconductor layer may be carried out according to the prior art in this step, it may be a dry etching, and may also be a wet etching or the combination of the two. As regards etching of composite conductive film layers for forming the source electrode and the drain electrode in this step, a wet etching is adopted, and as far as the etching principle is concerned, the cell reaction as mentioned herein is employed for etching. Taking a composite material layer of a source electrode and a drain electrode that is formed of Al and ITO in the embodiment as an example, an etching solution passes through ostioles on the second film layer, and when Al and ITO encounter an alkaline solution simultaneously, they undergo the following cell reactions:

Anode: $Al+4OH^- \rightarrow H_2AlO_3^- + H_2O + 3e$;

Cathode: $In_2O_3 + 3H_2O + 6e \rightarrow 2In^{3+} + 6OH^-$ 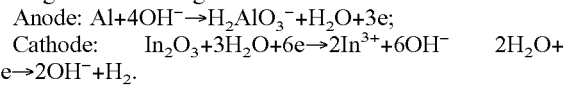 $2H_2O + 2e \rightarrow 2OH^- + H_2$.

The etching solution in the embodiment is sodium hydroxide solution, or potassium hydroxide solution, or tetramethylammonium hydroxide solution. An active layer is mainly IGZO. IGZO contains In, but due to the existence of $Ga_2O_3$, its etching speed is very slow. IGZO cannot be corroded by an alkaline solution approximately, and an active layer of IGZO is not affected by etching.

Specifically speaking, in this step, it is possible that a gate insulating layer, a material layer being a compound semiconductor layer, and a composite conductive film layer are deposited firstly, and next a first masking process is performed on the semiconductor layer and the composite conductive film layer, so as to form pattern of an active layer, as illustrated in FIG. 3(b); after that, a second masking process is performed on the composite conductive film layer separately, so as to form pattern of a source electrode and a drain electrode, as illustrated in FIG. 3(c).

Alternatively, this step may also adopt the conventional practice: a material layer being a semiconductor layer is deposited firstly, next, a first masking process is performed on the material layer being the semiconductor layer, so as to form pattern of an active layer; afterwards, a composite conductive film layer is formed, and a second masking process is performed on the composite conductive film layer, so as to form pattern of a source electrode and a drain electrode.

In another manufacturing method of a thin film transistor, step 1 is the same as the step 1 of the first manufacturing method. In step 2, firstly, a gate insulating layer, a layer of a compound semiconductor material, and a group of composite conductive film layers for forming a source electrode and a drain electrode are sequentially deposited, and next, through double-tone masking process (also called as semi-exposure process, Half-Tone or Gray-Tone), one masking process is performed on the semiconductor layer and the composite conductive film layers, and pattern of an active layer and the source electrode as well as the drain electrode can be formed. Thus, a mask is cut down. Specifically, as illustrated in FIG. 4(b), a photoresist is coated, and a channel region (which has to be etched until the active layer 23 is exposed) undergoes semi-exposure, so as to retain a certain thickness of the photoresist; the semiconductor layer and the composite conductive film layers outside the thin film transistor need to etched away completely, and the photoresist in a corresponding region undergoes full-exposure; no etch is conducted at preset locations for the source electrode and the drain electrode of the thin film transistor, so that all the thickness of the photoresist is retained, and the photoresist in a corresponding region does not undergo exposure, as illustrated in FIG. 4(b). The first etching is conducted, to etch away the semiconductor layer, the source electrode and the drain electrode outside the thin film transistor fully, and pattern of an active layer is formed; an ashing treatment is conducted to thin the remaining photoresist, and a source electrode 241 and a drain electrode 242 in a channel region are exposed; the second etching is conducted, so as to etch the channel region until the active layer 23 is exposed, and pattern of the source electrode 241 and the drain electrode 242 is formed, as illustrated in FIG. 4(c).

Step 3, a passivation layer material is deposited, and subjected to patterning process, so as to form a passivation layer 25 and a passivation-layer via hole (which is located over a drain electrode generally), as illustrated in FIG. 3(d) and FIG. 4(d).

In this step, a passivation layer (Passivation) is deposited, and then by photoresist coating, exposure, development and etching, a contact hole for an electrode (i.e. the passivation-layer via hole) is formed, and an active layer of IGZO is passivation-protected by it. The passivation layer (Passivation) is an insulating material with a monolayered or multilayered composite structure, such as, silicon oxide, silicon nitride, aluminum oxide, hafnium oxide, an organic insulating medium or the like.

FIG. 3(a) to FIG. 3(d) illustrate the first manufacturing method, and FIG. 4(a) to FIG. 4(d) show the second manufacturing method. The difference between the two lies in that upon formation of a source electrode, a drain electrode and an active layer, the first manufacturing method adopts two masking processes, and the second manufacturing method adopts one masking process.

In addition, in view of the fact that a developing solution and some cleaning liquids during the process are alkaline, in order to ensure that a composite conductive film layer for forming a source electrode and a drain electrode is not eroded during these procedures, a layer of a conductive material, such as molybdenum (Mo), titanium (Ti) or the like, may be further deposited over the composite conductive film layer to serve as a protective layer. This material can act to stop a cell reaction from occurring. Therefore, the composite layer structure of the source electrode and the drain electrode may also be a sandwich structure containing a layer of conductive material in the uppermost level, and this conductive material may be a metal, such as molybdenum (Mo), titanium (Ti) or the like. When a source electrode and a drain electrode with the above sandwich structure are etched, firstly, a portion of a metal layer in the uppermost level in correspondence with a region that needs to be removed in patterning of the source electrode and the drain electrode, is etched away with an acid etching solution. By means of controlling etch speed of the acid etching solution, after a portion of the metal layer in the uppermost level needed to be etched is just removed totally, or when a second film layer is overetched slightly, an alkaline solution is then adopted to pattern the composite conductive film layers, so that the source electrode and the drain electrode are formed. This scheme can be applied to the first manufacturing scheme and the second manufacturing scheme simultaneously. Besides, a composite conductive film layer of the second manufacturing scheme may also be formed by the sputtering process.

With respect to the thin film transistor and the manufacturing method thereof provided by at least an embodiment of the invention, without the need of adding an etch barrier layer, the thin film transistor can be manufactured by directly using a back channel etch process. Thus, the number of patterning process can be decreased, and the manufacturing cost is reduced.

In some circuit designs, such as in a driving circuit of an OLED (organic light emitting diode), it is necessary to connect a drain electrode of a switching TFT and a gate electrode of a driving TFT, and in this case, how to realize interconnection should also be taken into consideration during the manufacturing process. One specific implementing mode may be that, before deposition of composite conductive film layers for forming a source electrode and a drain electrode, a via hole is formed in a gate insulating layer through photoresist coating, exposure, development and etching processes, and the source electrode or the drain electrode is directly connected to a gate electrode through the via hole; another specific implementing mode is that, after a via hole is formed in a passivation layer (Passivation) and a gate insulating layer (step 3), a source electrode or a drain electrode and a gate electrode are connected together by another layer of a highly conductive material.

According to at least an embodiment of the invention, there is further provided a display device, which includes any of above-mentioned thin film transistors. Regarding the display device, the number of patterning process is small, and the cost is low. The display device may be a liquid crystal panel, an electronic paper, an OLED panel, a cell phone, a tablet computer, a television, a display, a notebook computer, a digital photo frame, a navigator or any other product or component having a display function.

With respect to the thin film transistor and manufacturing method thereof as well as a display device provided by embodiments of the invention, there is a limitation to the forming materials of a source electrode and a drain electrode of the thin film transistor and used etching solution: the source electrode and the drain electrode are formed with at least two materials, and the forming materials of the source electrode and the drain electrode can create a cell reaction in a corresponding etching solution so as to be etched, furthermore, the etching solution does not corrode the active layer. Based on the scheme provided by embodiments of the invention, a new back channel TFT structure can be achieved, and it is especially suitable for compound semiconductor TFTs, examples of which are oxide TFTs, so that the problem that an active layer in a TFT structure such as an oxide thin film transistor or the like is liable to be corroded in the etching procedure of a source electrode and a drain electrode can be solved. Without the need of adding an etch barrier layer, a thin film transistor can be manufactured by directly using a back channel etch process. Consequently, the number of patterning process can be decreased, and the manufacturing cost is reduced. Furthermore, upon formation of a source electrode and a drain electrode, the two materials can be removed simultaneously by a cell reaction, without etching each material separately, and the cell reaction has a fast etching speed, thereby saving the etch time.

For the convenience of clear description, "first", "second" and other wordings are employed in the present invention to make categorical discrimination between similar items, and the wordings "first" and "second" do not set a limit to the present invention in number, and are merely exemplary illustrations of an optional mode. Any similar variant or relevant expansion, which is obvious and conceived by those skilled in the art based on contents disclosed by the present invention, falls within the protection scope of the invention.

Descriptions made above are merely exemplary embodiments of the present invention, but are not used to limit the protection scope of the invention. The protection scope of the invention is determined by the attached claims.

This application claims the benefit of priority from Chinese patent application No. 201510134375.1 filed on Mar. 25, 2015, the disclosure of which is incorporated herein in its entirety by reference as a part of the present application.

The invention claimed is:

1. A manufacturing method of a thin film transistor, comprising the following steps:
   providing a base substrate;
   forming a gate electrode and a gate insulating layer;
   forming an active layer, a source electrode, and a drain electrode, includes:
      forming a first material layer and a second material layer, the second material layer having pinholes therein, the pinholes allowing an etching solution subsequently adopted to get through the second material layer; and
      etching the first material layer and the second material layer by a cell reaction in the etching solution so as to form a source electrode and a drain electrode, wherein, the etching solution passes through the pinholes of the second material layer, and the first material layer and the second material layer simultaneously encounter the etching solution; wherein, in the cell reaction, one of the first material layer and the second material layer is oxidized and the other one of the first material layer and the second material layer is reduced, and a material of the active layer is not corroded by the etching solution.

2. The manufacturing method claimed as claim 1, wherein, the source electrode and the drain electrode are a composite conductive film layer formed of a part of the first material layer and a part of the second material layer.

3. The manufacturing method claimed as claim 2, wherein,
   the pinholes in the second material layer is formed by way of sputtering.

4. The manufacturing method claimed as claim 1, wherein, forming the active layer, the source electrode and the drain electrode includes:
   depositing a compound semiconductor thin film and the composite conductive film layer on the gate insulating layer; and
   patterning the compound semiconductor thin film and the first material layer and the second material layer with a double-tone masking process, so as to obtain a compound semiconductor active layer and the source electrode, the drain electrode.

5. The manufacturing method claimed as claim 1, wherein, the first material layer is aluminum layer and the second material layer is indium tin oxide layer; and the etching solution is an alkaline solution.

6. The manufacturing method claimed as claim 1, after forming the first material layer and the second material layer, and before simultaneously etching the first material layer and the second material layer by a cell reaction in a corresponding etching solution, further comprising:
   forming a metal layer on the first material layer and the second material layer; and
   patterning the metal layer with an etching process, so that the metal layer in a region corresponding to the source electrode and the drain electrode is retained.

7. The manufacturing method claimed as claim 4, wherein, a material of the compound semiconductor thin film includes one or more selected from the group consisting of indium gallium zinc oxide, indium tin zinc oxide, indium titanium zinc oxide, zinc tin oxide, aluminum zinc tin oxide, aluminum zinc oxide, gallium zinc oxide, cadmium sulfide, cadmium selenide, cadmium telluride, gallium nitride, gallium phosphide, gallium arsenide and molybdenum sulfide.

8. The manufacturing method claimed as claim 6, wherein, a material of the metal layer includes at least one of metal molybdenum and metal titanium.

* * * * *